(12) United States Patent
Goldschmidt et al.

(10) Patent No.: US 7,340,672 B2
(45) Date of Patent: Mar. 4, 2008

(54) PROVIDING DATA INTEGRITY FOR DATA STREAMS

(75) Inventors: Marc A. Goldschmidt, Scottsdale, AZ (US); Robert L. Sheffield, Chandler, AZ (US); Mark A. Schmisseur, Phoenix, AZ (US); Richard C. Beckett, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 577 days.

(21) Appl. No.: 10/946,479

(22) Filed: Sep. 20, 2004

(65) Prior Publication Data

US 2006/0074960 A1 Apr. 6, 2006

(51) Int. Cl.
*H03M 13/05* (2006.01)

(52) U.S. Cl. ...................... 714/801; 714/800

(58) Field of Classification Search ............... 714/800, 714/801
See application file for complete search history.

(56) References Cited

U.S. PATENT DOCUMENTS

| 2003/0084400 A1* | 5/2003 | Kaku et al. ................. 714/800 |
| 2003/0140298 A1* | 7/2003 | Koprivica ................... 714/758 |
| 2005/0066230 A1* | 3/2005 | Bean et al. ................... 714/13 |

OTHER PUBLICATIONS

Coomes, J., "SBC 32 Byte Commands for End-to-End Data Protection", T10/03-307 revision 6- preliminary, [online] Feb. 23, 2004, retrieved from the Internet at <URL: http://www.t10.org/ftp/t10/document.03/03-307r6.pdf>, 12 pp.

Coomes, J., "SBC 32 Byte Commands for End-to-End Data Protection", T10/03-307 revision 7, [online], Apr. 21, 2004, retrieved from the Internet at <URL: http://www.t10.org/ftp/t10/document.03/03-307r7.pdf>, 42 pp.

"Data Integrity Extension", T-10/03-111, [online], [retrieved on Aug. 2, 2006], retrieved from the Internet at <URL: http://www.t10.org/ftp/t10/document.03/03-111r0.pdf>, 18 pp.

Gibson, G., "Reliable, Parallel Storage Architecture: RAID & Beyond", [online], Nov. 2004, retrieved from the Internet at <URL: http://www.pdl.cmu.edu/RAIDtutorial/Sigarch95.pdf>, 74 pp.

Penokie, G., "SPC-3; SBC-2; End-to-End Data Protection", t10/03-365 revision 1, [online], Nov. 6, 2003, retrieved from the Internet at <URL: http://www.t10.org/ftp/t10/document.03/03-365r1.pdf>, 43 pp.

* cited by examiner

*Primary Examiner*—R. Stephen Dildine
(74) *Attorney, Agent, or Firm*—Rabindranath Dutta; Konrad Raynes & Victor LLP

(57) ABSTRACT

Provided are a method, system, and article of manufacture for providing data integrity for data streams. Input data streams are received. A parity data stream is generated by computing parity data from the input data streams, wherein the parity data stream comprises data blocks. Data integrity fields are computed for the data blocks, wherein a data integrity field is used to ensure the integrity of a data block for which the data integrity field is computed. The computed data integrity fields are added to the data blocks to generate an output stream.

27 Claims, 9 Drawing Sheets

PROVIDING DATA INTEGRITY FOR DATA STREAMS

BACKGROUND

A block guard operation may associate a data integrity field with a fixed size user data field. For example, a eight byte data integrity field may be associated with a 512 byte user data field. The data integrity field may add an extra layer of protection to the user data field against errors, such as, multi-bit Error Correcting Code (ECC) errors, etc. Data integrity field may be appended to the data blocks of a data stream. Data blocks that include both the user data field and the data integrity field may be referred to as expanded data blocks, while data blocks that include only the user data field may be referred to as compressed data blocks. Further details of the block guard operation and data integrity fields are described in the publications entitled "SPC-3; SBC-2; Simplified End-to-End Data Protection" (Document number 03-365R1) authored by George O. Penokie, published on Nov. 06, 2003 by the T10 Technical Committee, and "SBC, 32 Byte Commands for End-to-End Data Protection" (Document number 03-307R7), authored by Jim Coomes, published on Mar. 19, 2004 by the T10 Technical Committee.

Redundant Array of Independent Disks (RAID) is a mechanism for making disks fault tolerant. RAID may use an ECC, known as parity, to recover from single point of failure errors, i.e., the failure of a single disk. RAID may stripe the data and parity across a plurality of disks to improve the speed of data retrieval and at the same time allow for fault tolerance. There are a number of different RAID levels, such as, RAID level 0, 1, 2, 3, 4, 5. RAID level 5 provides data striping at the byte level and also provides stripe error correction information. In RAID level 5, the parity corresponding to data on a plurality of disks may be computed and the parity may be used to recover from a disk failure without losing any data.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Figure 1:
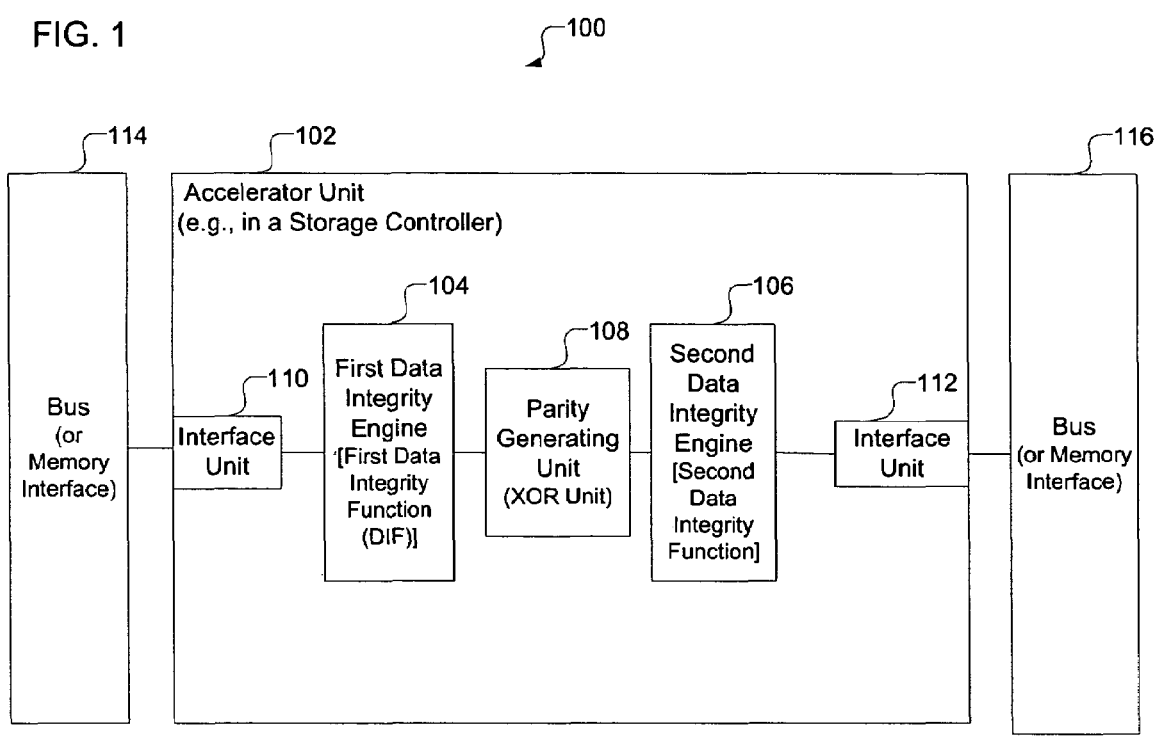
FIG. 1 illustrates a computing environment, in accordance with certain embodiments.

FIG. 1 illustrates a computing environment 100, in accordance with certain embodiments. An accelerator unit 102 is comprised of two data integrity engines 104, 106, a parity generating unit 108, and two interface units 110, 112. The accelerator unit 102 is capable of receiving inputs from a bus or a memory interface 114 via the interface unit 110 and is capable of generating outputs to a bus or a memory interface 116 via the interface unit 112.

In certain embodiments, the accelerator unit 102, the bus 114, and the bus 116 may be implemented in a computational device, such as, a personal computer, a workstation, a server, a mainframe, a hand held computer, a palm top computer, a laptop computer, a telephony device, a network computer, a blade computer, etc. In certain embodiments, the accelerator unit 102 may be implemented in a storage controller. The accelerator unit 102 may be implemented in hardware, firmware, software or any combination thereof.

The accelerator unit 102 is capable of receiving input data streams from the bus 114 and process the input data streams by the first data integrity engine 104, the parity generating unit 108, and the second data integrity engine 106 to generate at least one output data stream for the bus 116. In certain embodiments, the at least one output data stream may be a parity data stream that has been augmented with one or more data integrity fields, where a data integrity field is used to ensure the integrity of a data block for which the data integrity field is computed.

The first and second data integrity engines 104, 106 are capable of applying a first and a second data integrity function respectively to a stream of data. In certain embodiments, the first and second data integrity engines 104, 106 may perform block guard operations by applying data integrity functions to a stream of data. In certain additional embodiments, applying a data integrity function to a data stream augments the blocks of the data stream with a data integrity field. For example, if a data block comprising a user data field of the data stream is 512 bytes, then an eight byte data integrity field may be added to the 512 byte data block to form a 520 byte expanded data block.

FIG. 1 illustrates an embodiment in which the accelerator unit 102 receives a plurality of input data streams and generates at least one output data stream, where the at least one output data stream incorporates data integrity fields with the parity information computed from the input data streams. In certain embodiments, the second data integrity engine 106 may be absent in the accelerator unit 102, and the parity generating unit 108 may be directly coupled to the interface unit 112. In certain alternative embodiments, the first data integrity engine 104 may be absent in the accelerator unit 102, and the interface unit 110 may be directly coupled to the parity generating unit 108. In certain embodiments, an output data stream that may be generated by the accelerator unit 102 may be referred to as a block guarded parity data stream.

Figure 2:
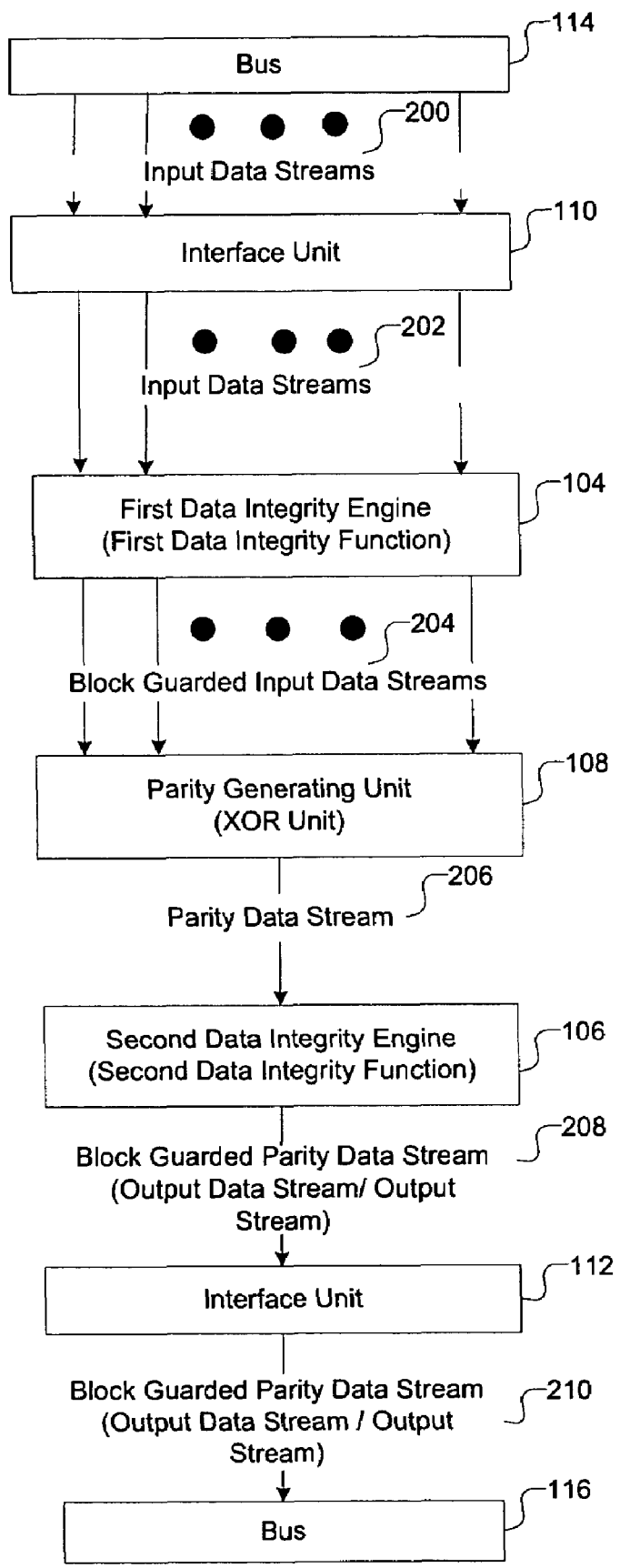
FIG. 2 illustrates how a block guarded parity data stream is generated from input data streams.

FIG. 2 illustrates how a block guarded parity data stream is generated from input data streams in the computing environment 100. The interface unit 110 receives input data streams 200 from the bus 114, and transforms the input data streams 200 into input data streams 202 for the first data integrity engine 104. In certain embodiments, the first data integrity engine 104 applies a first data integrity function to the input data streams 202 to generate block guarded input data streams 204 for the parity generating unit 108. The first data integrity engine 104 may also apply additional data integrity functions to the input data streams 202. The first data integrity engine 104 may apply the same data integrity function to the different streams of the input data streams 202 or may apply different data integrity functions to different streams of the input data streams 202.

The first data integrity engine 104 sends the block guarded input data streams 204 to the parity generating unit 108. The parity generating unit 108 may generate a parity data stream 206 from the block guarded input data streams 204. For example, in certain embodiments, if there are three block guarded input data streams 204 then the parity generating unit 108 may generate a single parity data stream 206 that includes the parity information calculated from the three block guarded input data streams 204. In certain embodiments, the parity generating unit 108 may generate other data streams in addition to the parity data stream 206. In certain alternative embodiments, the parity generating unit 108 may directly receive the input data streams 202 from the interface unit 110 and generate the parity data stream 206.

The parity generating unit 108 sends the parity data stream 206 to the second data integrity engine 106. The second data integrity engine 206 applies a second data integrity function to the parity data stream 106 to generate an output data stream 208 comprising a block guarded parity data stream 208. In certain embodiments, the second data integrity engine 106 may also apply additional data integrity functions besides the second data integrity function to the parity data stream 206 to generate the block guarded parity data stream 208. The second data integrity engine 106 sends the block guarded parity data stream 208 to the interface unit 112. The interface unit 112 transforms the block guarded parity data stream 208 into a block guarded parity data stream 210 and sends the block guarded parity data stream 210 to the bus 116. In certain alternative embodiments, the parity generating unit 108 may directly send the parity data stream 206 to the interface unit 112 for transmission to the bus 116.

FIG. 2 illustrates an embodiment in which the accelerator unit 102, comprising the interface units 110, 112, the first and second data integrity engines 104, 106 and the parity generating unit 108, receives the input data streams 200 and generates a block guarded parity data stream 210. In certain embodiments, the accelerator unit 102 may also generate additional output data streams besides the block guarded parity data stream 210.

Figure 3:
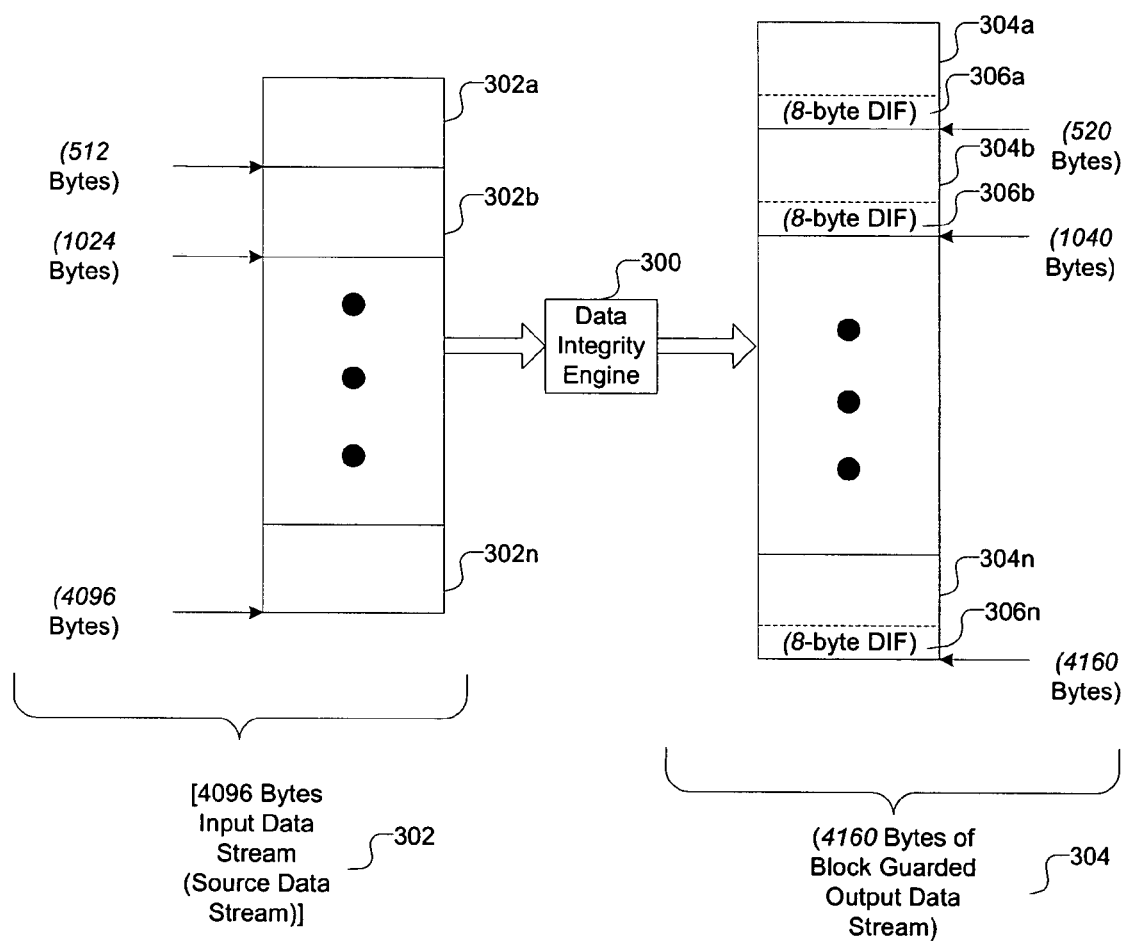
FIG. 3 illustrates how an exemplary data integrity engine generates an output data stream from an input data stream.

FIG. 3 illustrates how an exemplary data integrity engine 300 generates an output data stream from an input data stream in the computing environment 100. In certain embodiments, the exemplary data integrity engine 300 may comprise either the first data integrity engine 104 or the second data integrity engine 106.

The exemplary data integrity engine 300 receives an input data stream 302, i.e., a source data stream, that is comprised of a plurality of blocks 302a . . . 302n, where each block is 512 bytes in size. The input data stream 302 is 4096 bytes in size, i.e., there are eight blocks of 512 bytes each in the input data stream 302.

The data integrity engine 300 applies a data integrity function to the input data stream 302 to generate an output data stream 304 that is comprised of a plurality of blocks 304a . . . 304n. The data integrity function applied to the input data stream 302 may append a eight byte data integrity field to a block of the input data stream 302. For example, an eight byte data integrity field 306a may be added to the 512 byte block 302a to generate the 520 byte block 304a, an eight byte data integrity field 306b may be added to the 512 byte block 302b to generate the 520 byte block 304b, and an eight byte data integrity field 306n may be added to the 512 byte block 302n to generate the 520 byte block 304n.

After the data integrity engine 300 has applied the data integrity function to the input data stream 302, in certain embodiments each generated block of the output data stream 304 includes an eight byte data integrity field. In the exemplary embodiment illustrated in FIG. 3, the size of the output data stream is 4160 bytes and includes the added data integrity fields 306a, 306b, . . . 306n.

In alternative embodiments, the number of bytes of the input data stream 302, the number of bytes of the output data stream 304, the number of bytes in the blocks 302a . . . 302n, 304a . . . 304n, and the number of bytes in the data integrity fields 306a . . . 306n may be different from those shown in FIG. 3.

FIG. 3 illustrates an embodiment in which the data integrity engine 300 generates an output data stream 304 by adding data integrity fields 306a . . . 306n to blocks 302a . . . 302n of an input data stream 302. In alternative embodiments, the data integrity engine 300 may apply other data integrity functions that may or may not add data integrity fields 306a . . . 306n to the input stream 302. The output data stream 304 comprises block guarded data.

Figure 4:
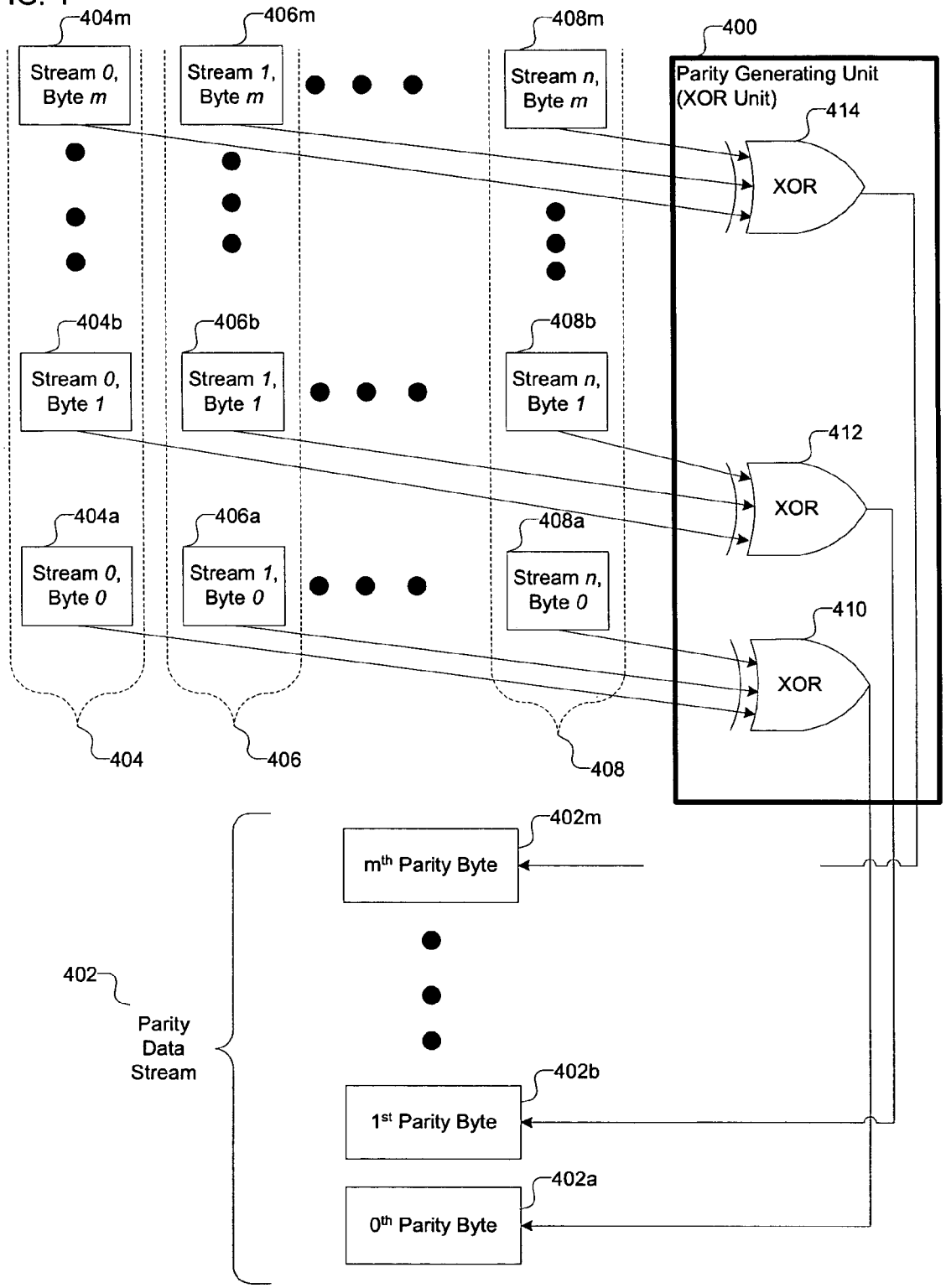
FIG. 4 illustrates how a parity generating unit generates a parity data stream from a plurality of input data streams.

FIG. 4 illustrates how a parity generating unit 400 generates a parity data stream 402 from a plurality of input data streams 404, 406, 408. While FIG. 4 shows three input data streams 404, 406, 408, in alternative embodiments there may be a greater or a fewer number of input data streams. In FIG. 4, the input data streams 400, 406, and 408 are shown as streams 0, 1, and n respectively.

Input data stream 404 comprises a plurality of bytes 404a, 404b, . . . 404m that are received in succession by the parity generating unit 400, input data stream 406 comprises a plurality of bytes 406a, 406n, . . . 406m that are received in succession by the parity generating unit 400, and input data stream 408 comprises a plurality of bytes 408a, 408b, . . . 408m that are received in succession by the parity generating unit 400. For example, in the input data stream 404, the $0^{th}$ byte 404a is first received by the parity generating unit 400, then the $1^{st}$ byte 404b is received by the parity generating unit 400, and subsequently the $m^{th}$ byte 404m is received by the parity generating unit 400. In alternative embodiments, the bytes of the input data streams 404, 406, 408 may be stored in buffers and the buffers are capable of being accessed by the parity generating unit 400. In such embodiments, the parity generating unit 400 may be configured to receive the bytes of the input streams 404, 406, 408 in any order.

In certain embodiments, the parity generating unit 400 performs an exclusive OR operation on the corresponding bytes of the input data streams 404, 406, 408 to generate the parity data stream 402. For example, the parity generating unit 400 may first perform an exclusive OR operation 410 with the $0^{th}$ bytes 404a, 406a, 408a of the input streams 404, 406, 408 respectively to generate the $0^{th}$ parity byte 402a of the parity data stream 402. Then the parity generating unit 400 may perform an exclusive OR operation 412 with the $1^{st}$ bytes 404b, 406b, 408b of the input streams 404, 406, 408 respectively to generate the $1^{st}$ parity byte 402b of the parity data stream 402. Subsequently, the parity generating unit 400 may perform an exclusive OR operation 414 with the $m^{th}$ bytes 404m, 406m, 408m of the input streams 404, 406, 408 respectively to generate the $m^{th}$ parity byte 402m of the parity data stream 402. In certain embodiments, the exclusive OR operations 410, 412, 414 are bitwise exclusive OR operations and the parity generating unit 400 may be referred to an XOR unit. In alternative embodiments, the parity generating unit 400 may generate the parity data stream 402 from the input data streams 404a, 406, 408b by operations that are different from the exclusive OR operations 410, 25 412, 414.

Therefore, FIG. 4 illustrates an embodiment in which the parity generating unit 400 takes a plurality of input data streams 404, 406, 408 and generates a parity data stream 402. In certain embodiments, the parity generating unit 400 may correspond to the parity generating unit 106 of the computing environment 100. The input data streams 404, 406, 408 in the parity generating unit 400 may correspond to either the input data streams 202 shown in FIG. 2 or the block guarded input data streams 204 shown in FIG. 2. In certain embodiments, the parity data stream 402 may correspond to the parity data stream 206 shown in FIG. 2.

Figure 5:
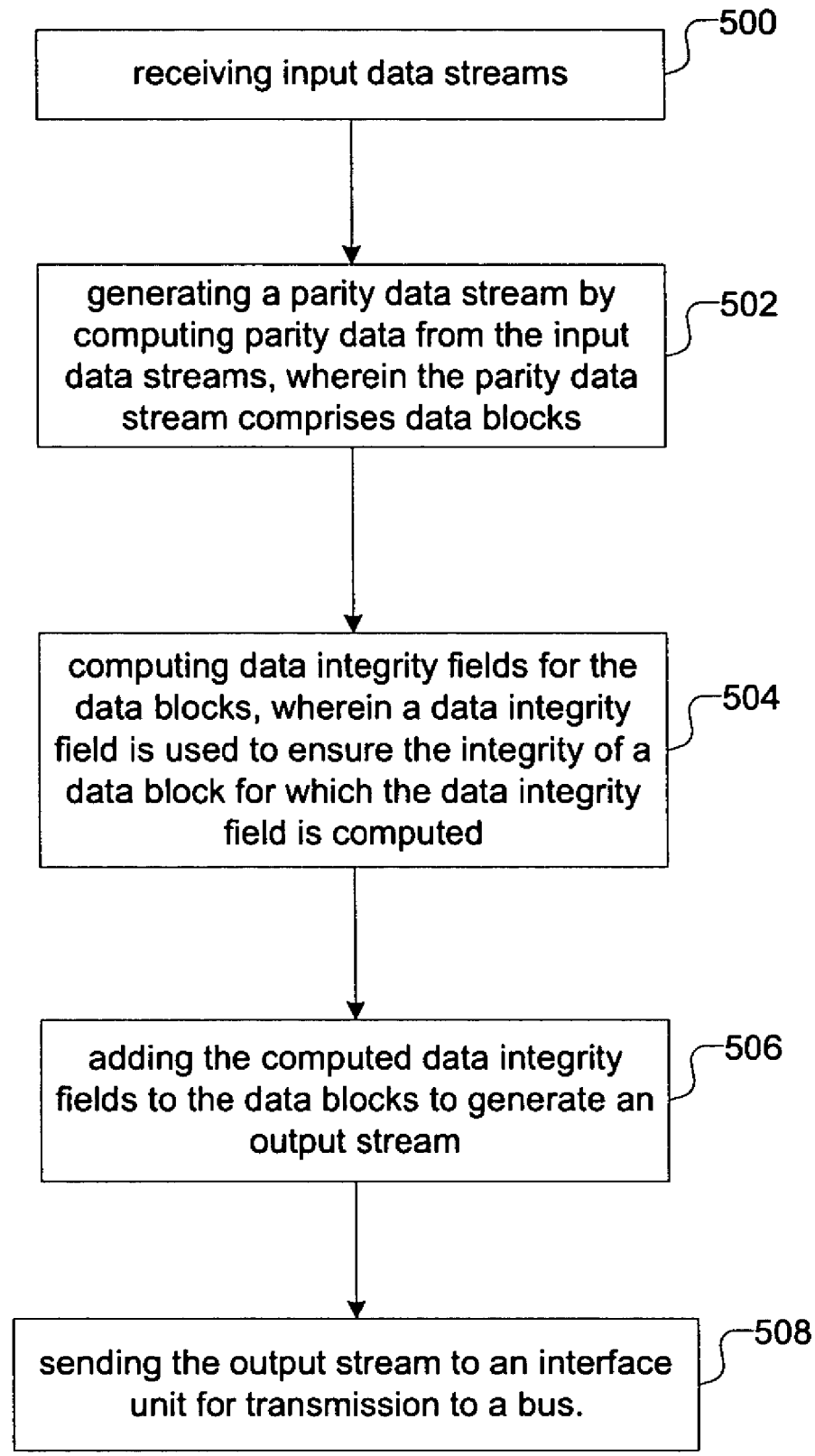
FIG. 5 illustrates operations for generating an output stream from input data streams.

FIG. 5 illustrates operations for generating an output data stream from input data streams. The operations may be implemented in the parity generating unit 108 and a data integrity engine, such as, the second data integrity engine 106 of the accelerator unit 102.

Control starts at block 500, where the parity generating unit 108 receives input data streams, such as input data streams 202 or block guarded input data streams 204. The parity generating unit 108 is capable of processing both block guarded input data streams as well as input data streams that are not block guarded. For example, in certain embodiments, the input data streams 202 generated by the interface unit 110 is received directly by the parity generating unit 108. In other embodiments the input data streams received by the parity generating unit 108 correspond to the block guarded input data streams 204.

The parity generating unit 108 generates (at block 502) a parity data stream 206 by computing parity data from the input data streams, where the parity data stream 206 may be comprised of a plurality of data blocks, where each data block may comprise a plurality of bytes of the parity data stream 206.

A data integrity engine, such as, the second data integrity engine 106, computes (at block 504) data integrity fields for the data blocks, where a data integrity field is used to ensure the integrity of a data block for which the data integrity field is computed. For example, in certain embodiments, the second data integrity engine 106 receives the parity data stream 206 and the second data integrity engine 106 computes data integrity fields of the data blocks of the parity data stream 206.

The data integrity engine adds (at block 506) the computed data integrity fields to the data blocks to generate an output stream. For example, in certain embodiments the second data integrity engine 106 adds the computed data integrity fields to the data blocks of the parity data stream 206 to generate the output stream 210.

In certain embodiments, the data integrity engine sends (at block 508) the output stream 210 to an interface, such as, the interface unit 112, for transmission to a bus, such as, the bus 116. In certain alternative embodiments, the parity generating unit 108 may forward the parity data stream 206 directly to the interface unit 112 for transmission to the bus 116, where the parity data stream 206 is generated from input data streams that include data integrity fields. For example, the input data streams received by the parity generating unit 108 in block 500, may include data integrity fields. In such embodiments, control may be transferred directly from block 502 to block 508.

FIG. 5 illustrates an embodiment in which a block guarded parity data stream is generated from a plurality of input data streams. In certain embodiments, the operations performed by the parity generating unit and the data integrity engine may be implemented in a single processing unit that combines the functions of the parity generating unit and the data integrity engine.

Figure 6:
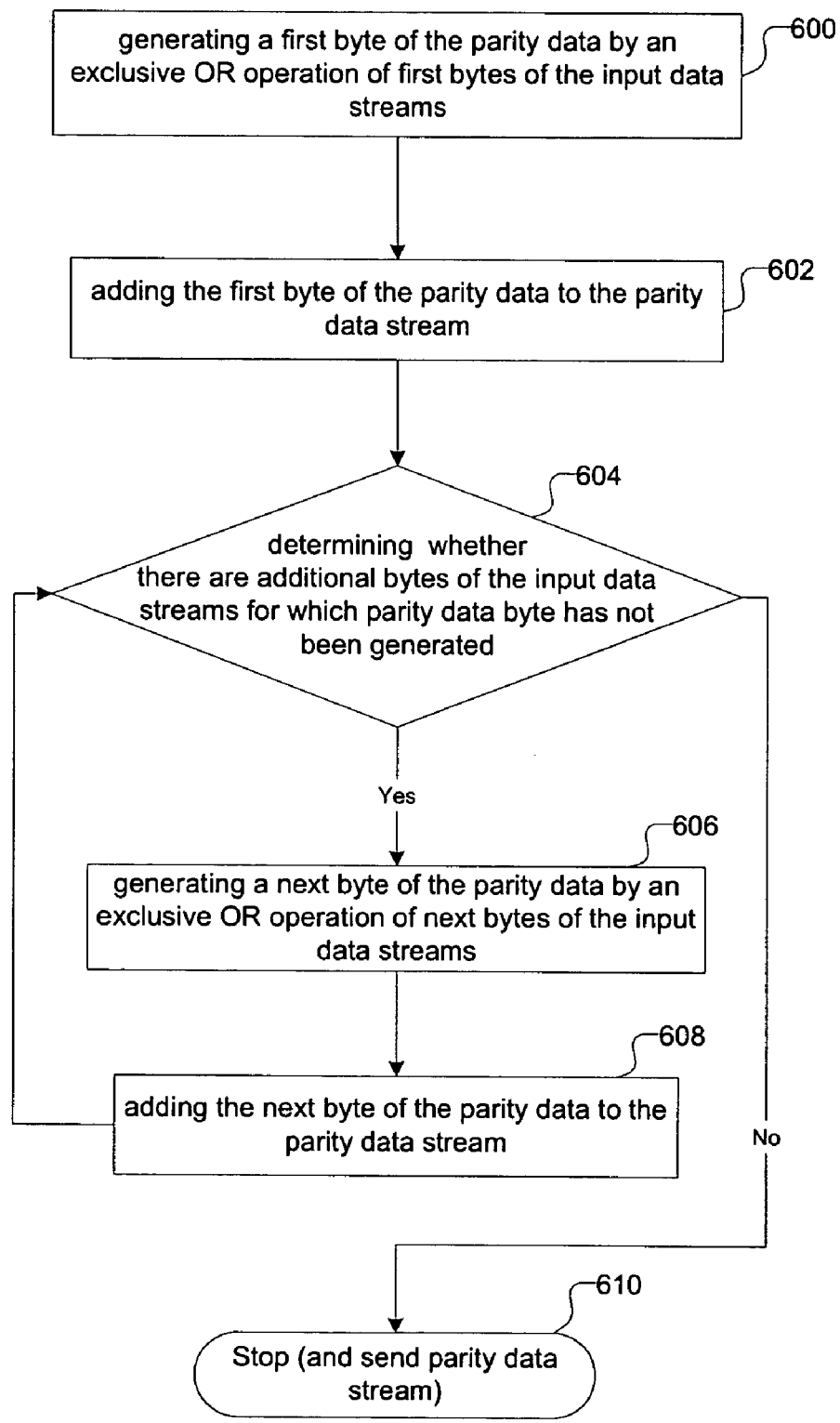
FIG. 6 illustrates operations performed by a parity generating unit.

FIG. 6 illustrates operations performed by a parity generating unit, such as the parity generating unit 108 or the parity generating unit 400. In certain embodiments, the operations described in blocks 600-610 of FIG. 6 may be performed by the parity generating unit 108 to implement the operations described in block 502 of FIG. 5.

Control starts at block 600, where the parity generating unit after receiving input data streams, such as input data streams 202, 204 generates a first byte of parity data by an exclusive OR operation of first bytes of the input data streams. For example, in certain exemplary embodiments, the parity generating unit may perform an exclusive OR operation on bytes 404a, 406a, 408a of the input data streams 404, 406, 408 to generate the parity byte 402a.

The parity generating unit adds (at block 602) the first byte of parity data to the parity data stream. For example, in certain exemplary embodiments the parity generating unit may add the parity byte 402a to the parity data stream 402.

The parity generating unit determines (at block 604) whether there are additional bytes of the input data streams for which parity data byte, i.e., the corresponding byte of parity data, has not been generated. If so, the parity generating unit generates (at block 606) a next byte of parity data by an exclusive OR operation of next bytes of the input data streams. For example, in certain embodiments, after generating the parity byte 402a, the parity generating unit generates the next parity byte 402b by an exclusive OR operation of the next bytes 404b, 406b, 408b of the input data streams 404, 406, 408.

The parity generating unit adds (at block 608) the next byte of parity data to the parity data stream. For example, in certain exemplary embodiments the parity generating unit adds the next byte of parity data 402b to the parity data stream 402, after adding the first byte of parity data 402a to the parity data stream 402. Control returns to block 604, where a determination is made as to whether there are additional bytes of the input data streams whose parity data has not been generated. In alternative embodiments, buffers may be used to process a plurality of bytes of parity data at a time.

If a determination is made (at block 604) that there are no additional bytes of the input data streams whose parity data has not been generated, then the process stops (at block 610) and the parity data stream may be sent to another unit from the parity generating unit. For example, after the parity byte 402m has been added to the parity data stream 402, there are no additional bytes of the input data streams whose parity data has not been generated, and the parity data stream 402 may be sent to another unit, such as, the second data integrity engine 106.

FIG. 6 illustrates an embodiment in which a parity data stream is generated from input data streams by performing exclusive OR operations on corresponding bytes of the input data streams to generate parity data.

Figure 7:
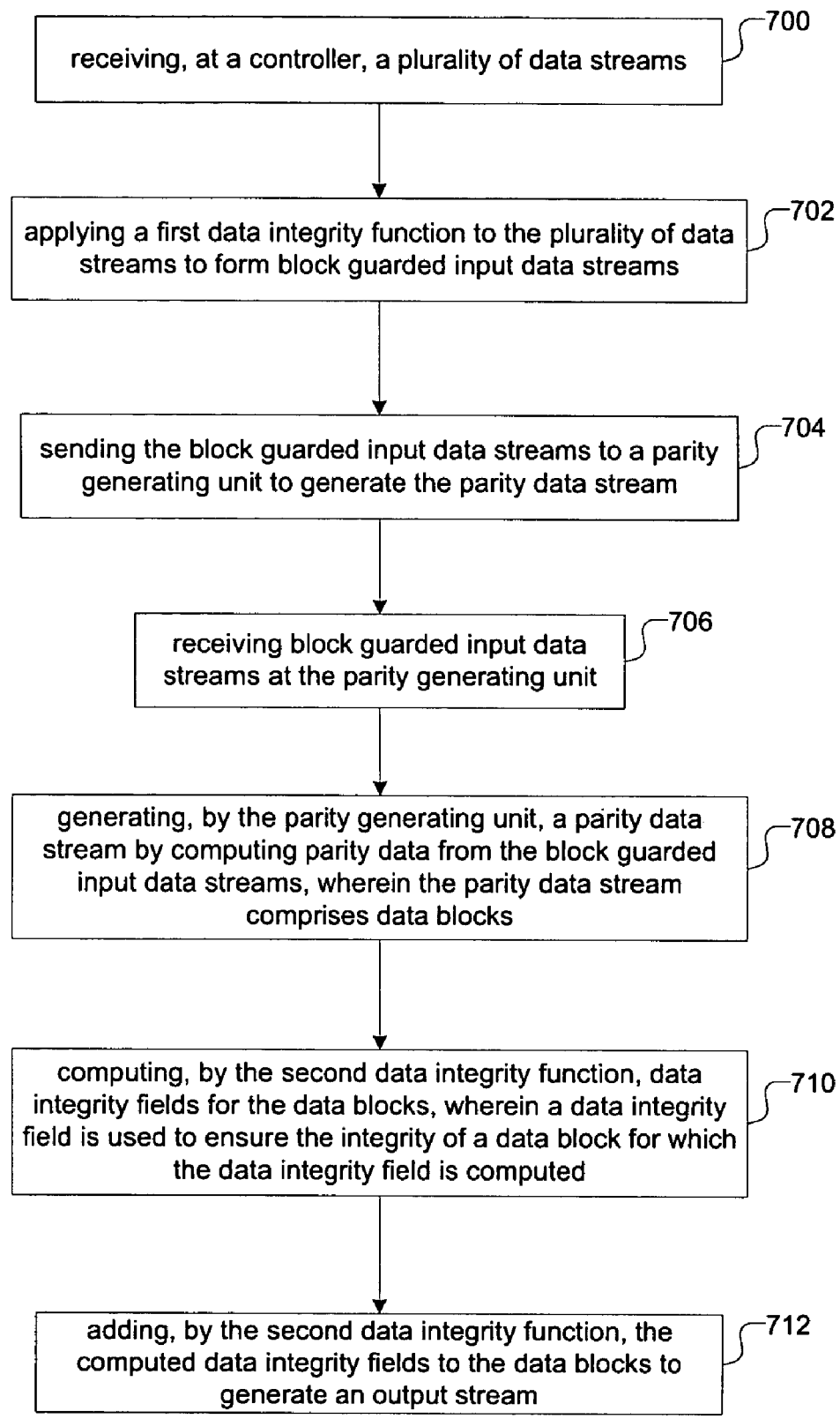
FIG. 7 illustrates operations for generating an output stream from input data streams by using first and second data integrity functions, and a parity generating unit.

FIG. 7 illustrates operations for generating an output stream from input data streams by using first and second data integrity functions, and a parity generating unit. The operations described in FIG. 7 may be implemented in a controller comprising the accelerator unit 102.

Control starts at block 700, where the controller, such as the accelerator unit 102, receives a plurality of data streams. A first data integrity engine 104 applies (at block 702) a first data integrity function to the plurality of data streams to form block guarded input data streams 204. The first data integrity engine 104 sends (at block 704) the block guarded input data streams 204 to a parity generating unit 108 to generate the parity data stream 206.

The operations described in subsequent block 706-710 of FIG. 7, may in certain embodiments correspond to certain operations already described in FIG. 5. At block 706, the block guarded input data streams 204 are received at the parity generating unit 108.

The parity generating unit 108 generates (at block 708) a parity data stream 206 by computing parity data from the block guarded input data streams 204, where the parity data stream 206 comprises data blocks.

The second data integrity engine 106 uses the second data integrity function to compute (at block 710) data integrity fields for the data blocks, where a data integrity field is used to ensure the integrity of a data block for which the data integrity field is computed. The second data integrity function adds (at block 712) the computed data integrity fields to the data blocks to generate an output stream 208. In certain embodiments, the generated output stream in a block guarded parity data stream.

FIG. 7 illustrates certain embodiments in which the input data streams 202 are processed by a first data integrity engine 104 to generate block guarded input data streams 204. The block guarded input data streams 204 are processed by a parity generating unit 108 to generate a parity data stream 206. The parity data stream 206 is processed by a second data integrity engine 106 to generate a block guarded parity data stream 208.

Figure 8:
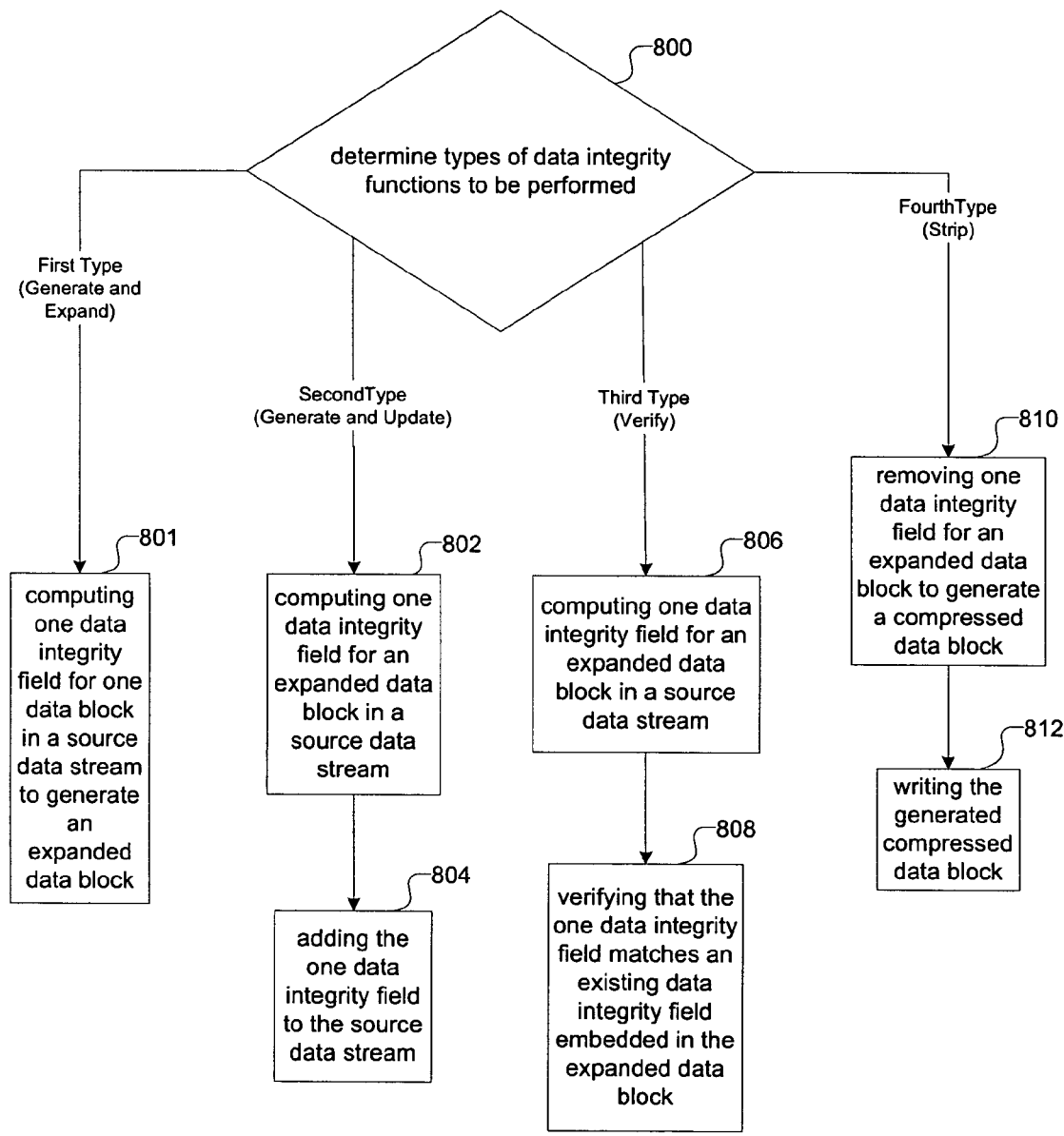
FIG. 8 illustrates different types of data integrity functions performed by data integrity engines.

FIG. 8 illustrates operations performed by first and second data integrity functions in the first and second data integrity engines 104, 106 respectively. During the process of generating the block guarded parity data stream 208, 210 by the accelerator unit 102, the first and second data integrity engines 104, 106 may in certain embodiments also perform the operations described in FIG. 8. Additional operations for ensuring data integrity, beyond those described in FIG. 8, may also be performed by the first and second data integrity engines 104, 106.

Control starts at block 800, where a data integrity engine, such as, data integrity engines 104, 106, determines the type of data integrity functions to be performed. For example, in certain embodiments, the first data integrity engine 104 may determine that in addition to the first data integrity function other types of data integrity functions would also be applied on the input data streams 202.

For a first type of data integrity function to be performed, the data integrity engine may compute (at block 801) one data integrity field for one data block in a source data stream to generate an expanded data block, where a source data stream is any input data stream to the data integrity engine. The first type of data integrity function may be referred to as a generate and expand data integrity function. The source data stream includes data blocks that are compressed, i.e., the data blocks do not include a data integrity field. Data integrity fields are added to generate expanded data blocks from the compressed data blocks.

For a second type of data integrity function to be performed, the data integrity engine may compute (at block 802) one data integrity field for an expanded data block in a source data stream and add (at block 804) the one data integrity field to the source data stream. The second type of data integrity function may be referred to as a generate and update data integrity function. The source data stream includes data blocks that are already expanded, i.e., the data blocks include data integrity fields. Additional or updated data integrity fields are added when the second type of data integrity function is applied to the source data stream.

For a third type of data integrity function to be performed, the data integrity engine may compute (at block 806) one data integrity field for an expanded data block in a source data stream and verify (at block 808) that the one data integrity field matches an existing data integrity field already embedded in the expanded data block. The third type of data integrity function may be referred to as a verify data integrity function.

For a fourth type of data integrity function to be performed, the data integrity engine may remove (at block 810) one data integrity field for an expanded data block to generate a compressed data block, and write (at block 812) the generated compressed data block. The fourth type of data integrity function may be referred to as a strip data integrity function. Other types of data integrity functions may also be performed by the data integrity engine.

FIG. 8 illustrates embodiments in which a data integrity engine performs several data integrity functions. Additional data integrity functions may be performed on compressed or expanded data blocks during the process of generating the block guarded parity data stream 208.

Certain embodiments combine one or more data integrity engines with a parity generating unit comprising an XOR unit to support block guard capabilities recommended by the T10 Technical Committee of the InterNational Committee on Information Technology. Certain embodiments provide the capability to perform both XOR functions used for RAID level 5 and block guard functions comprising data integrity functions in a single hardware unit. External storage applications may use some of the embodiments to provide data protection features.

The described techniques may be implemented as a method, apparatus or article of manufacture involving software, firmware, micro-code, hardware and/or any combination thereof. The term "article of manufacture" as used herein refers to program instructions, code and/or logic implemented in circuitry [e.g., an integrated circuit chip, Programmable Gate Array (PGA), Application Specific Integrated Circuit (ASIC), etc.] and/or a computer readable medium (e.g., magnetic storage medium, such as hard disk drive, floppy disk, tape), optical storage (e.g., CD-ROM, DVD-ROM, optical disk, etc.), volatile and non-volatile memory device (e.g., Electrically Erasable Programmable Read Only Memory (EEPROM), Read Only Memory (ROM), Programmable Read Only Memory (PROM), Random Access Memory (RAM), Dynamic Random Access Memory (DRAM), Static Random Access Memory (SRAM), flash, firmware, programmable logic, etc.). Code in the computer readable medium may be accessed and executed by a machine, such as, a processor. In certain embodiments, the code in which embodiments are made may further be accessible through a transmission medium or from a file server via a network. In such cases, the article of manufacture in which the code is implemented may comprise a transmission medium, such as a network transmission line, wireless transmission media, signals propagating through space, radio waves, infrared signals, etc. Of course, those skilled in the art will recognize that many modifications may be made without departing from the scope of the embodiments, and that the article of manufacture may comprise any information bearing medium known in the art. For example, the article of manufacture comprises a storage medium having stored therein instructions that when executed by a machine results in operations being performed. Furthermore, program logic that includes code may be implemented in hardware, software, firmware or many combination thereof. The described operations of FIGS. 2, 5, 6, 7, 8 may be performed by circuitry, where "circuitry" refers to either hardware or software or a combination thereof. The circuitry for performing the operations of the described embodiments may comprise a hardware device, such as an integrated circuit chip, a PGA, an ASIC, etc. The circuitry may also comprise a processor component, such as an integrated circuit, and code in a computer readable medium, such as memory, wherein the code is executed by the processor to perform the operations of the described embodiments.

Figure 9:
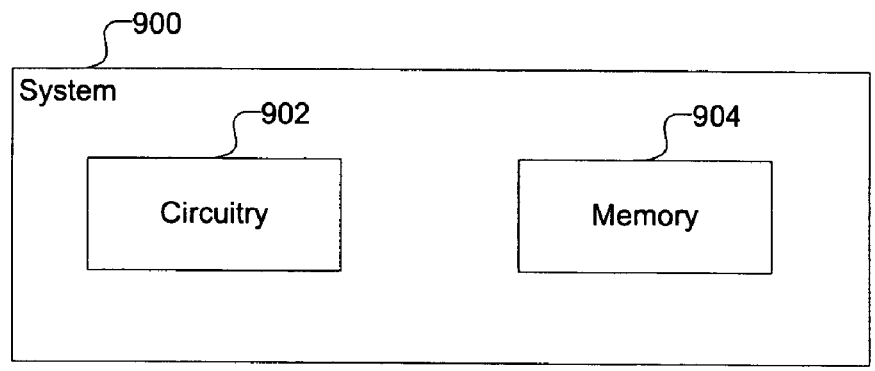
FIG. 9 illustrates a block diagram of a first system corresponding to certain elements of the computing environment, in accordance with certain embodiments.

Certain embodiments illustrated in FIG. 9 may implement a system 900 comprising circuitry 902 coupled to a memory 904, wherein the circuitry 902 is operable to: receive input data streams; generate a parity data stream by computing parity data from the input data streams, wherein the parity data stream comprises data blocks; compute data integrity fields for the data blocks, wherein a data integrity field is used to ensure the integrity of a data block for which the data integrity field is computed; and, add the computed data integrity fields to the data blocks to generate an output stream. In certain embodiments, the circuitry 902 and the memory 904 may comprise a device, such as, a storage controller in which the accelerator unit 102 is implemented. In certain other embodiments, the circuitry 902 and the memory 904 may comprise a device, such as, the accelerator unit 102, where the accelerator unit 102 is not part of a storage controller. In certain additional embodiments, the circuitry 902 and the memory 904 may comprise any device that is capable of performing the operations performed by the accelerator unit 102.

Figure 10:
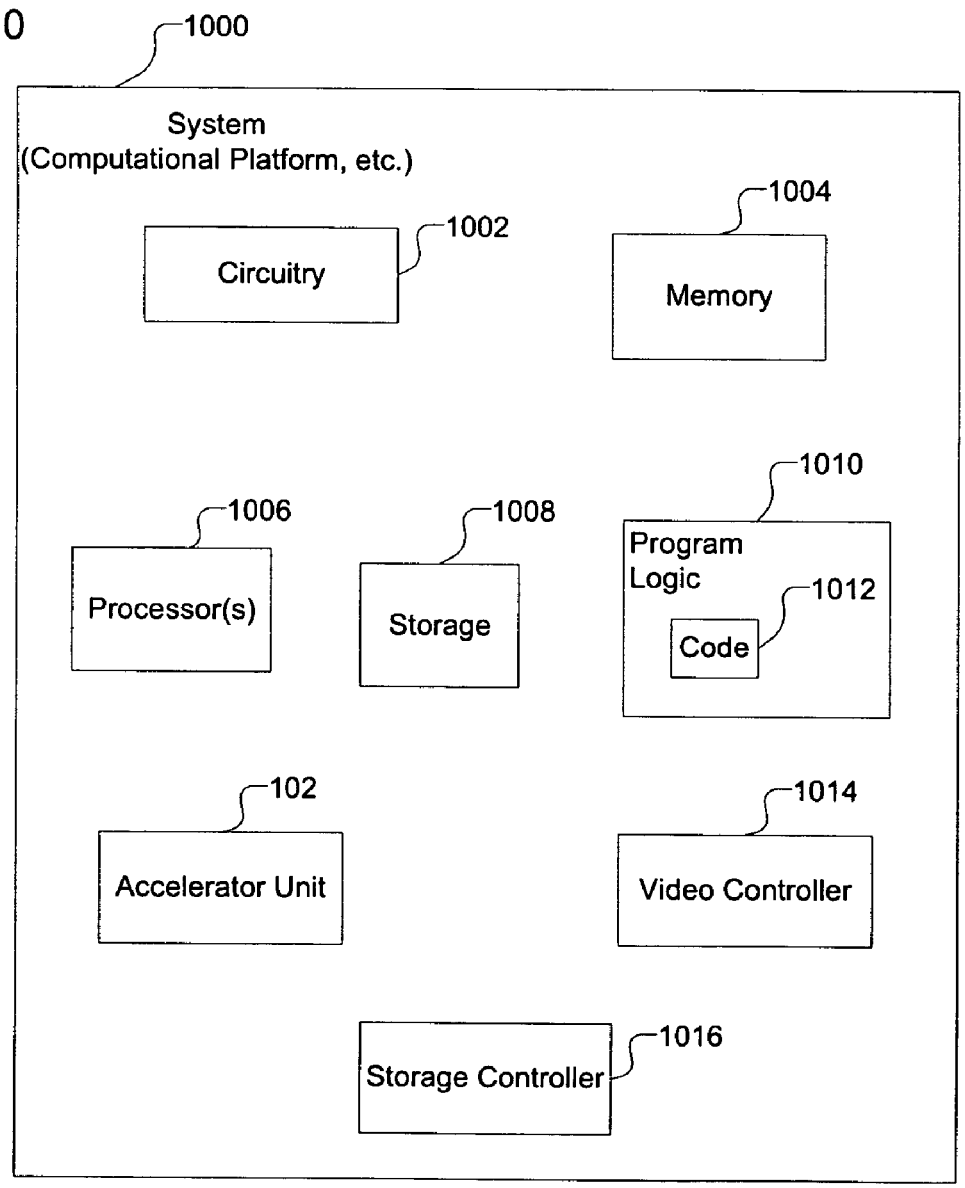
FIG. 10 illustrates a block diagram of a second system including certain elements of the computing environment, in accordance with certain embodiments.

FIG. 10 illustrates a block diagram of a system 1000 in which certain embodiments may be implemented. Certain embodiments may be implemented in systems that do not require all the elements illustrated in the block diagram of the system 1000. The system 1000 may include circuitry 1002 coupled to a memory 1004, wherein the described operations of FIGS. 2, 5, 6, 7, 8 may be implemented by the circuitry 1002. In certain embodiments, the system 1000 may include a processor 1006 and a storage 1008, wherein the storage 1008 may be associated with program logic 1010 including code 1012, that may be loaded into the memory 1004 and executed by the processor 1006. In certain embodiments the program logic 1010 including code 1012 is implemented in the storage 1008. In certain embodiments, the operations performed by program logic 1010 including code 1012 may be implemented in the circuitry 1002. Additionally, the system 1000 may also include a video controller 1014 and a storage controller 1016. In certain embodiments, the system 1000 may include the accelerator unit 102 implemented by the circuitry 1002, the memory 1004, the processors 1006, the storage 1008, and the program logic 1010. Although, the accelerator unit 102 is shown outside the storage controller 1016, in certain embodiments the accelerator unit 102 may be implemented in the storage controller 1016.

Certain embodiments may be implemented in a computer system including the video or graphics controller 1014 to render information to display on a monitor coupled to the system 1000 including the accelerator unit 102, where the computer system may comprise a desktop, workstation, server, mainframe, laptop, handheld computer, etc. An operating system may be capable of execution by the computer system, and the video controller 1014 may render graphics output via interactions with the operating system. Alternatively, some embodiments may be implemented in a computer system that does not include the video or graphics controller 1014, such as, a switch, router, etc.

Certain embodiments may be implemented in a computer system including the storage controller 1016, such as, a Small Computer System Interface (SCSI) controller, an AT Attachment Interface (ATA) controller, a Redundant Array of Independent Disk (RAID) controller, etc., that manages access to a non-volatile storage device, such as a magnetic disk drive, tape media, optical disk, etc. Furthermore, in certain embodiments a device comprising the storage controller 1016 may be included in a card coupled to a computer system or on a motherboard of a computer system. Certain alternative embodiments may be implemented in a computer system that does not include the storage controller 1016, such as, certain hubs and switches.

At least certain of the operations of FIGS. 2, 5-8 can be performed in parallel as well as sequentially. In alternative embodiments, certain of the operations may be performed in a different order, modified or removed. Furthermore, many of the software and hardware components have been described in separate modules for purposes of illustration. Such components may be integrated into a fewer number of components or divided into a larger number of components. Additionally, certain operations described as performed by a specific component may be performed by other components.

The data structures and components shown or referred to in FIGS. 1-10 are described as having specific types of information. In alternative embodiments, the data structures and components may be structured differently and have fewer, more or different fields or different functions than those shown or referred to in the figures. Therefore, the foregoing description of the embodiments has been presented for the purposes of illustration and description. It is not intended to be exhaustive or to limit the embodiments to the precise form disclosed. Many modifications and variations are possible in light of the above teaching.

What is claimed is:

1. A method, comprising:

receiving input data streams;

generating a parity data stream by computing parity data from the input data streams, wherein the parity data stream comprises data blocks;

computing data integrity fields for the data blocks, wherein a data integrity field is used to ensure the integrity of a data block for which the data integrity field is computed; and adding the computed data integrity fields to the data blocks to generate an output stream, wherein the receiving, the generating, the computing, and the adding are performed by at least one of code in a computer readable storage medium executed by a processor and hardware logic.

2. The method of claim 1, wherein the input data streams and the parity data stream comprise a plurality of bytes, and wherein generating the parity data stream further comprises:

generating a first byte of the parity data by an exclusive OR operation of first bytes of the input data streams;

adding the first byte of the parity data to the parity data stream;

generating a next byte of the parity data by an exclusive OR operation of next bytes of the input data streams, in response to determining that there are additional bytes of the input data streams for which parity data byte has not been generated; and adding the next byte of the parity data to the parity data stream.

3. The method of claim 1, wherein the parity data stream is generated by a parity generating unit, and farther comprising:

computing, by a data integrity function, one data integrity field for one data block in a source data stream.

4. The method of claim 1, wherein the input data streams are block guarded input data streams, wherein the hardware logic implements a controller, the method further comprising:

receiving, at a controller, a plurality of data streams;

applying a data integrity function to the plurality of data streams to form the block guarded input data streams; and sending the block guarded input data streams to a parity generating unit to generate the parity data stream.

5. The method of claim 4, wherein the data integrity function is a first data integrity function, wherein computing the data integrity fields and adding the computed data integrity fields to the data blocks are performed by a second data integrity function, wherein the parity data stream is generated by a parity generating unit, and wherein the first and second data integrity functions further perform:

computing one data integrity field for an expanded data block in a source data stream; and adding the one data integrity field to the source data stream.

6. The method of claim 4, wherein the data integrity function is a first data integrity function, wherein computing the data integrity fields and adding the computed data integrity fields to the data blocks are performed by a second data integrity function, wherein the parity data stream is generated by a parity generating unit, and wherein the first and second data integrity functions further perform:

computing one data integrity field for an expanded data block in a source data stream; and verifying that the one data integrity field matches an existing data integrity field embedded in the expanded data block.

7. The method of claim 4, wherein the data integrity function is a first data integrity function, wherein computing the data integrity fields and adding the computed data integrity fields to the data blocks are performed by a second data integrity function, wherein the parity data stream is generated by a parity generating unit, and wherein the first and second data integrity functions farther perform:

removing one data integrity field for an expanded data block to generate a compressed data block; and writing the generated compressed data block.

8. The method of claim 1, wherein the hardware logic implements a storage controller comprising a parity generating unit, a data integrity engine, and an interface unit, wherein the parity data stream is generated by the parity generating unit, wherein computing the data integrity fields and adding the computed data integrity fields to the data blocks are performed by the data integrity engine, the method further comprising:

sending the output stream to the interface unit for transmission to a bus.

9. A system, comprising:
memory; and
circuitry implemented in hardware, wherein the circuitry is coupled to the memory, and wherein the circuitry is operable to:
 (i) receive input data streams;
 (ii) generate a parity data stream by computing parity data from the input data streams, wherein the parity data stream comprises data blocks;
 (iii) compute data integrity fields for the data blocks, wherein a data integrity field is used to ensure the integrity of a data block for which the data integrity field is computed; and
 (iv) add the computed data integrity fields to the data blocks to generate an output stream.

10. The system of claim 9, wherein the input data streams and the parity data stream comprise a plurality of bytes, and wherein the circuitry is further operable to:

generate a first byte of the parity data by an exclusive OR operation of first bytes of the input data streams;

add the first byte of the parity data to the parity data stream;

generate a next byte of the parity data by an exclusive OR operation of next bytes of the input data streams, in response to determining that there are additional bytes of the input data streams for which parity data byte has not been generated; and add the next byte of the parity data to the parity data stream.

11. The system of claim 9, further comprising a parity generating unit and a data integrity function, wherein the parity data stream is generated by the parity generating unit, and wherein the circuitry is further operable to:

compute, by the data integrity function, one data integrity field for one data block in a source data stream.

12. The system of claim 9, further comprising:
a controller, wherein the input data streams are block guarded input data streams, and wherein the circuitry is further operable to:
 (i) receive, at the controller, a plurality of data streams;
 (ii) apply a data integrity function to the plurality of data streams to form the block guarded input data streams; and
 (iii) send the block guarded input data streams to a parity generating unit to generate the parity data stream.

13. The system of claim 12, further comprising a parity generating unit, wherein the data integrity function is a first data integrity function, wherein computing the data integrity fields and adding the computed data integrity fields to the data blocks are performed by a second data integrity function, wherein the parity data stream is generated by the parity generating unit, and wherein the circuitry is further operable to:

compute one data integrity field for an expanded data block in a source data stream; and add the one data integrity field to the source data stream.

14. The system of claim 12, further comprising a parity generating unit, wherein the data integrity function is a first data integrity function, wherein computing the data integrity fields and adding the computed data integrity fields to the data blocks are performed by a second data integrity function, wherein the parity data stream is generated by the parity generating unit, and wherein the circuitry is further operable to:

compute one data integrity field for an expanded data block in a source data stream; and verify that the one data integrity field matches an existing data integrity field embedded in the expanded data block.

15. The system of claim 12, further comprising a parity generating unit, wherein the data integrity function is a first data integrity function, wherein computing the data integrity fields and adding the computed data integrity fields to the data blocks are performed by a second data integrity function, wherein the parity data stream is generated by the parity generating unit, and wherein the circuitry is further operable to:
  remove one data integrity field for an expanded data block to generate a compressed data block; and
  write the generated compressed data block.

16. The system of claim 9, further comprising a storage controller, wherein receiving, generating, computing, and adding are performed by the storage controller having a parity generating unit, a data integrity engine, and an interface unit, wherein the parity data stream is generated by the parity generating unit, wherein computing the data integrity fields and adding the computed data integrity fields to the data blocks are performed by the data integrity engine, and wherein the circuitry is further operable to:
  send the output stream to the interface unit for transmission to a bus.

17. A system, comprising:
  memory;
  a video controller coupled to the memory; and
    a storage controller coupled to the memory, wherein the storage controller has circuitry that is operable to:
    (i) receive input data streams;
    (ii) generate a parity data stream by computing parity data from the input data streams, wherein the parity data stream comprises data blocks;
    (iii) compute data integrity fields for the data blocks, wherein a data integrity field is used to ensure the integrity of a data block for which the data integrity field is computed; and
    (iv) add the computed data integrity fields to the data blocks to generate an output stream.

18. The system of claim 17, wherein the input data streams and the parity data stream comprise a plurality of bytes, and wherein the circuitry is further operable to:
  generate a first byte of the parity data by an exclusive OR operation of first bytes of the input data streams;
  add the first byte of the parity data to the parity data stream;
  generate a next byte of the parity data by an exclusive OR operation of next bytes of the input data streams, in response to determining that there are additional bytes of the input data streams for which parity data byte has not been generated; and
  add the next byte of the parity data to the parity data stream.

19. The system of claim 17, wherein the storage controller has an accelerator unit, wherein the accelerator unit has a parity generating unit, wherein the input data streams are block guarded input data streams, and wherein the circuitry is further operable to:
  (i) receive, at the accelerator unit, a plurality of data streams;
  (ii) apply a data integrity function to the plurality of data streams to form the block guarded input data streams; and
  (iii) send the block guarded input data streams to the parity generating unit to generate the parity data stream.

20. An article of manufacture, comprising a storage medium having stored therein instructions capable of being executed by a machine to:
  receive input data streams;
  generate a parity data stream by computing parity data from the input data streams, wherein the parity data stream comprises data blocks;
  compute data integrity fields for the data blocks, wherein a data integrity field is used to ensure the integrity of a data block for which the data integrity field is computed; and
  add the computed data integrity fields to the data blocks to generate an output stream.

21. The article of manufacture of claim 20, wherein the input data streams and the parity data stream comprise a plurality of bytes, and wherein the instructions are further capable of being executed to:
  generate a first byte of the parity data by an exclusive OR operation of first bytes of the input data streams;
  add the first byte of the parity data to the parity data stream;
  generate a next byte of the parity data by an exclusive OR operation of next bytes of the input data streams, in response to determining that there are additional bytes of the input data streams for which parity data byte has not been generated; and
  add the next byte of the parity data to the parity data stream.

22. The article of manufacture of claim 20, wherein the parity data stream is generated by a parity generating unit coupled to a data integrity function, and wherein the instructions are further capable of being executed to:
  compute, by the data integrity function, one data integrity field for one data block in a source data stream.

23. The article of manufacture of claim 20, wherein the input data streams are block guarded input data streams, and wherein the instructions are further capable of being executed to:
  receive a plurality of data streams;
  apply a data integrity function to the plurality of data streams to form the block guarded input data streams; and
  send the block guarded input data streams to a parity generating unit to generate the parity data stream.

24. The article of manufacture of claim 23, wherein the data integrity function is a first data integrity function, wherein computing the data integrity fields and adding the computed data integrity fields to the data blocks are performed by a second data integrity function, and wherein the instructions are further capable of being executed to:
  compute one data integrity field for an expanded data block in a source data stream; and
  add the one data integrity field to the source data stream.

25. The article of manufacture of claim 23, wherein the data integrity function is a first data integrity function, wherein computing the data integrity fields and adding the computed data integrity fields to the data blocks are performed by a second data integrity function, and wherein the instructions are further capable of being executed to:
  compute one data integrity field for an expanded data block in a source data stream; and
  verify that the one data integrity field matches an existing data integrity field embedded in the expanded data block.

26. The article of manufacture of claim 23, wherein the data integrity function is a first data integrity function, wherein computing the data integrity fields and adding the computed data integrity fields to the data blocks are performed by a second data integrity function, and wherein the instructions are further capable of being executed to:

remove one data integrity field for an expanded data block to generate a compressed data block; and write the generated compressed data block.

27. The article of manufacture of claim 20, wherein receiving, generating, computing, and adding are performed by a storage controller comprising a parity generating unit, a data integrity engine, and an interface unit, wherein the parity data stream is generated by the parity generating unit, wherein computing the data integrity fields and adding the computed data integrity fields to the data blocks are performed by the data integrity engine, and wherein the instructions are further capable of being executed to:

send the output stream to the interface unit for transmission to a bus.

* * * * *

UNITED STATES PATENT AND TRADEMARK OFFICE
CERTIFICATE OF CORRECTION

PATENT NO. : 7,340,672 B2  Page 1 of 1
APPLICATION NO. : 10/946479
DATED : March 4, 2008
INVENTOR(S) : Marc A. Goldschmidt et al.

It is certified that error appears in the above-identified patent and that said Letters Patent is hereby corrected as shown below:

Col. 11, Line 7, delete "and farther" and replace with --and further--.
Col. 11, Line 53, delete "farther perform" and replace with --further perform--.

Signed and Sealed this

Twenty-first Day of September, 2010

David J. Kappos
*Director of the United States Patent and Trademark Office*